United States Patent
Hwang et al.

(10) Patent No.: US 6,795,478 B2
(45) Date of Patent: Sep. 21, 2004

(54) VCSEL WITH ANTIGUIDE CURRENT CONFINEMENT LAYER

(75) Inventors: Wen-Yen Hwang, Sugar Land, TX (US); Klaus Alexander Anselm, Sugar Land, TX (US); Jun Zheng, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 10/109,288

(22) Filed: Mar. 28, 2002

(65) Prior Publication Data

US 2003/0185267 A1 Oct. 2, 2003

(51) Int. Cl.[7] .............................................. H01S 3/08
(52) U.S. Cl. ........................ 372/96; 372/43; 372/45; 372/46
(58) Field of Search ............................. 373/96, 46, 45; 372/96, 45, 46

(56) References Cited

U.S. PATENT DOCUMENTS

| | | | | |
|---|---|---|---|---|
| 4,949,350 A | | 8/1990 | Jewell et al. | |
| 5,115,441 A | * | 5/1992 | Kopf et al. | 372/45 |
| 5,245,622 A | * | 9/1993 | Jewell et al. | 372/45 |
| 5,331,654 A | * | 7/1994 | Jewell et al. | 372/45 |
| 5,343,487 A | * | 8/1994 | Scott et al. | 372/46 |
| 5,351,256 A | * | 9/1994 | Schneider et al. | 372/45 |
| 5,438,585 A | | 8/1995 | Armour et al. | |
| 5,446,752 A | * | 8/1995 | Ackley et al. | 372/46 |
| 5,493,577 A | * | 2/1996 | Choquette et al. | 372/46 |
| 5,513,202 A | * | 4/1996 | Kobayashi et al. | 372/96 |
| 5,539,759 A | | 7/1996 | Chang-Hasnain et al. | |
| 5,594,751 A | | 1/1997 | Scott | |
| 5,838,715 A | * | 11/1998 | Corzine et al. | 372/96 |
| 5,903,588 A | * | 5/1999 | Guenter et al. | 372/46 |
| 5,903,590 A | | 5/1999 | Hadley et al. | |
| 5,960,024 A | * | 9/1999 | Li et al. | 372/96 |
| 6,169,756 B1 | | 1/2001 | Chirovsky et al. | |
| 6,320,893 B1 | * | 11/2001 | Ueki | 372/96 |
| 6,411,638 B1 | * | 6/2002 | Johnson et al. | 372/46 |
| 6,493,373 B1 | * | 12/2002 | Boucart et al. | 372/96 |

OTHER PUBLICATIONS

Botez, D., et al., "Watt–Range, Coherent, Uniphase Powers from Phase–Locked Arrays of Antiguided Diode Lasers," *Appl. Phys. Lett.*, vol. 58, No. 19 (1991), pp. 2070–2072.
Choquette, K.D., et al., "Low ThresholdVoltage Vertical–Cavity Lasers Fabricated by Selective Oxidation," *Electronics Letters*, vol. 30, No. 24 (1994), pp. 2043–2044.
Deng, H. et al., "Oxide–Confined Vertical–Cavity Laser with Additional Etched Void Confinement," *Electronics Letters*, vol. 32, No. 10 (1996), pp. 900–901.
Hadley, G.R., " Modes of a Two Dimensional Phase–Locked Array of Vertical–Cavity Surface–Emitting Lasers," *Optics Letters*, vol. 15, No. 21 (1990), pp. 1215–1217.
Huffaker, D.L., et al., "Native–Oxide Defined Ring Contact for Low Threshold Vertical–Cavity Lasers," *Appl. Phys. Lett.*, vol. 65, vol. 1, (1994) pp. 97–99.
Lee, Y.H., et al., "Top–Surface–Emitting GaAs Four–Quantum–Well Lasers Emitting at 0·85 $\mu$m," *Electronics Letters*, vol. 26, No. 11 (1990) pp. 710–711.
Qian, Y., et al., "Long Wavelength (1.3 $\mu$m) Vertical–Cavity Surface–Emitting Lasers with a Wafer–Bonded Mirror and an Oxygen–Implanted Confinement Region," *Appl. Phys. Lett.*, vol. 71, No. 1 (1997) pp. 25–27.

* cited by examiner

*Primary Examiner*—Don Wong
*Assistant Examiner*—Dung Nguyen
(74) *Attorney, Agent, or Firm*—N. Stephan Kinsella

(57) ABSTRACT

A surface-emitting laser, such as a VCSEL, for generating single-transverse mode laser light at a lasing wavelength, has a first mirror and a second mirror positioned so as to define a laser cavity therebetween, and a semiconductor active region disposed between the first and second mirrors for amplifying, by stimulated emission, light in the laser cavity at the lasing wavelength. An annular antiguide structure is disposed within the laser cavity and between the active region and one of the first and second mirrors, the annular antiguide structure comprising an antiguide material and having a central opening, the central opening comprising a second material having an index of refraction for light at the lasing wavelength smaller than that of the antiguide material, whereby the annular antiguide structure causes preferential antiguiding of higher order transverse lasing modes in the laser cavity.

26 Claims, 7 Drawing Sheets

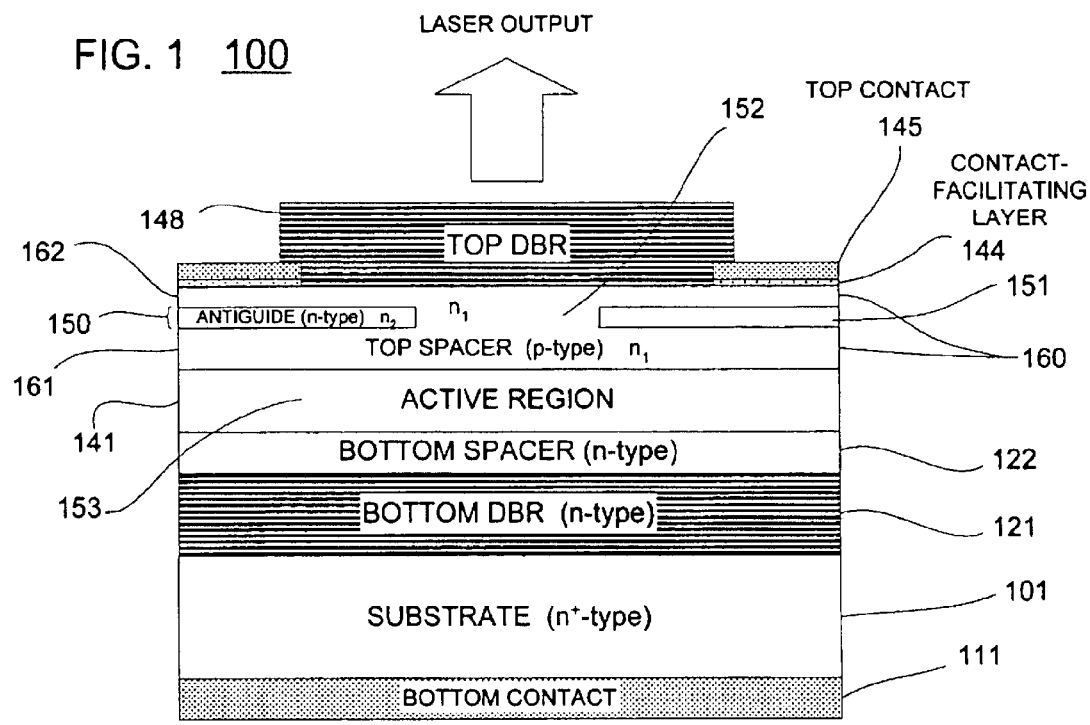

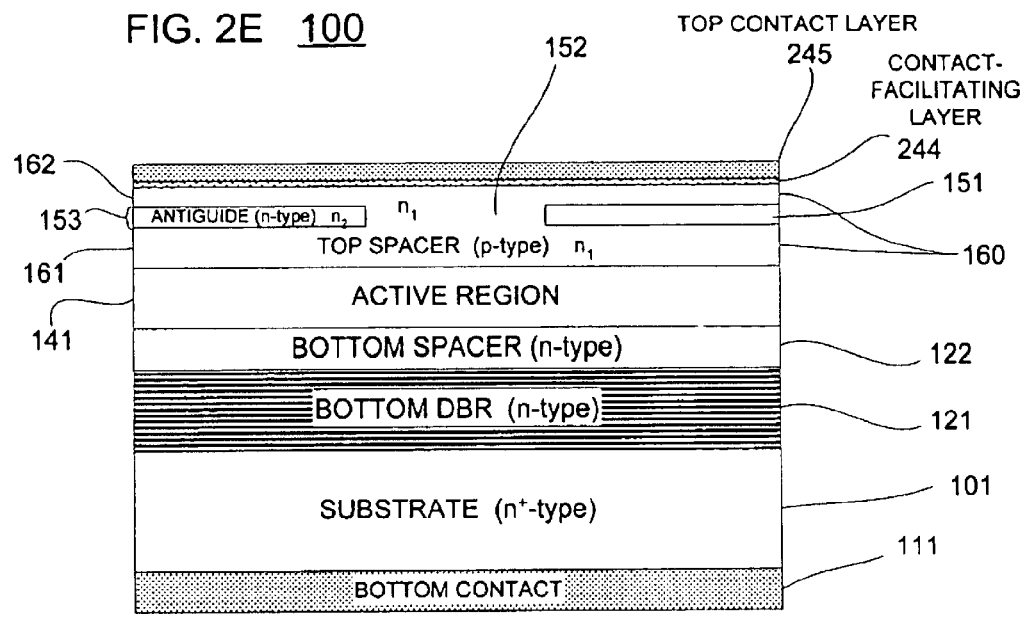
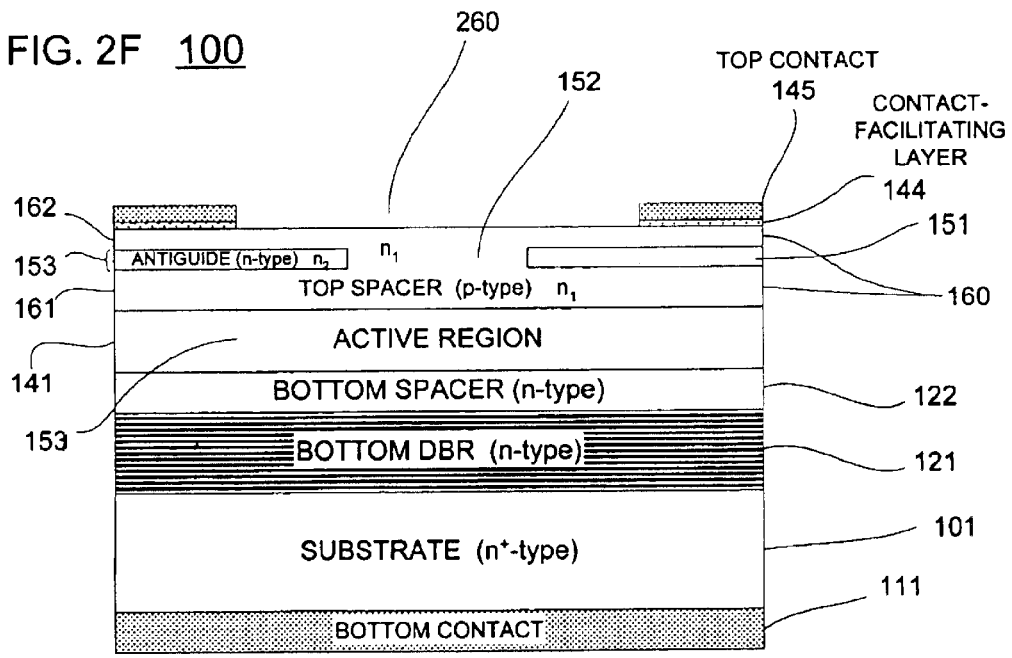

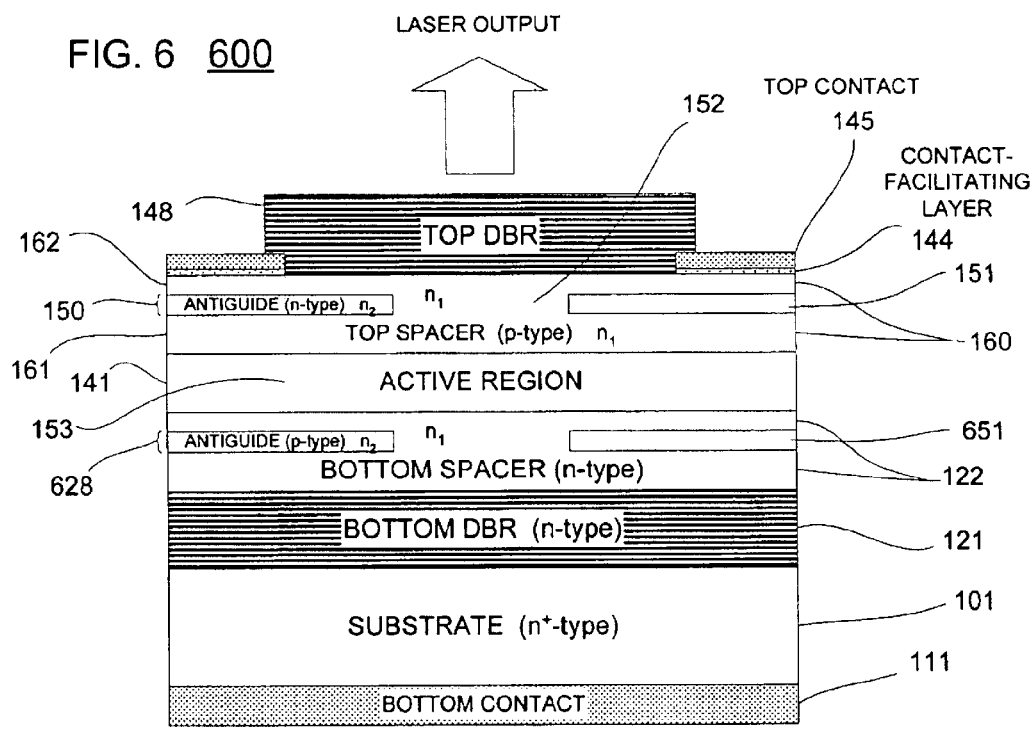

VCSEL WITH ANTIGUIDE CURRENT CONFINEMENT LAYER

BACKGROUND OF THE INVENTION

1. Field of the Invention

This invention relates to vertical-cavity surface-emitting lasers (VCSELs) and, in particular, to current confinement in VCSELs and single transverse mode operation thereof.

2. Description of the Related Art

The following descriptions and examples are not admitted to be prior art by virtue of their inclusion within this section.

There are several types of lasers, including gas lasers, solid-state lasers, liquid (dye) lasers, free electron, and semiconductor lasers. All lasers have a laser cavity defined by at least two laser cavity mirrors, and an optical gain medium in the laser cavity. The gain medium amplifies electromagnetic waves (light) in the cavity, i.e. provides optical gain, by the phenomenon known as stimulated emission. In semiconductor lasers, a semiconductor active region serves as the gain medium. Semiconductor lasers may be diode lasers (bipolar) or non-diode lasers such as quantum cascade (QC) lasers (unipolar). Semiconductor lasers are used for a variety of industrial and scientific applications and can be built with a variety of structures and semiconductor materials.

The use of semiconductor lasers for forming a source of optical energy is attractive for a number of reasons. Semiconductor lasers have a relatively small volume and consume a small amount of power as compared to conventional laser devices. Further, semiconductor lasers can be fabricated as monolithic devices, which do not require a combination of a resonant cavity with external mirrors and other structures to generate a coherent output laser beam.

Laser gain (or optical gain) is a measure of how well a gain medium such as an active region amplifies photons by stimulated emission. The primary function of the active region in a semiconductor laser is to provide sufficient laser gain to permit lasing to occur. The active region may employ various materials and structures to provide a suitable collection of atoms or molecules capable of undergoing stimulated emission at a given lasing wavelength, so as to amplify light at this wavelength. The active region may comprise, for example, a superlattice structure, or a single or multiple quantum well (MQW) structure.

Amplification by stimulated emission in the active region of a semiconductor laser is described as follows. The active region contains some electrons at a higher, excited state or energy level, and some at a lower, resting (ground) state or energy level. The number and percentage of excited electrons can be increased by pumping the active region with a pumping energy, such as an electrical current or optical pump. Excited electrons spontaneously fall to a lower state, "recombining" with a hole. Both radiative and non-radiative recombination events occur in the active region. When radiative recombination occurs, a photon is emitted with the same energy as the difference in energy between the hole and electron energy states.

Stimulated emission occurs when radiative recombination of an electron-hole pair is stimulated by interaction with a photon. In particular, stimulated emission occurs when a photon with an energy equal to the difference between the electron's energy and a lower energy interacts with the electron. In this case, the photon stimulates the electron to fall into the lower energy state, thereby emitting a second photon. The second photon will have the same energy and frequency as the original photon, and will also be in phase with the original photon. Thus, when the photons produced by spontaneous electron transition interact with other high energy state electrons, stimulated emission can occur so that two photons with identical characteristics are present. (Viewed as waves, the atom emits a wave having twice the amplitude as that of the original photon interacting with the atom.)

Amplification by stimulated emission requires more photons to be produced by stimulated emission than to be absorbed by lower-state electrons. This condition, known as population inversion, occurs when there are more excited (upper lasing level) electrons than ground-state (lower lasing level) electrons. If there were more lower state than upper state electrons, then more photons would be absorbed by the lower energy electrons (causing upward excitations) than would be produced by stimulated emission. When there is a population inversion, however, enough electrons are in the excited state so as to prevent absorption by ground-state electrons from sabotaging the amplification process. Thus, when population inversion is achieved, stimulated emission will predominate over stimulated absorption, thus producing amplication of light (optical gain). If there is population inversion, lasing is possible, if other necessary conditions are also present.

Population inversion is achieved by applying a sufficient pumping energy to the active region, to raise enough electrons to the excited state. In this manner, an active region amplifies light by stimulated emission. Various forms of pumping energy may be utilized to excite electrons in the active region and to achieve population inversion and lasing. For example, semiconductor lasers of various types may be electrically pumped (EP), by a DC or alternating current. Optical pumping (OP) or other pumping methods, such as electron beam pumping, may also be used. EP semiconductor lasers are typically powered by applying an electrical potential difference across the active region, which causes a current to flow therein. As a result of the potential applied, charge carriers (electrons and holes) are injected from opposite directions into an active region. This gives rise to an increase in spontaneous generation of photons, and also increases the number of excited state electrons so as to achieve population inversion.

In a semiconductor laser, an active region is sandwiched between the cavity mirrors, and pumped with a pumping energy to cause population inversion. Photons are spontaneously emitted in the active region. Some of those photons travel in a direction perpendicular to the reflectors of the laser cavity. As a result of the ensuing reflections, the photons travel through the active region multiple times, being amplified by stimulated emission on each pass through the active region. Thus, photons reflecting in the cavity experience gain when they pass through the active region. However, loss is also experienced in the cavity, for example less than perfect (100%) reflectivity of the cavity mirrors introduces loss by absorption, scattering, or even extraction of the output laser beam, which can be about 1% of the coherent cavity light.

Therefore, for lasing to occur, there must be not only gain (amplification by stimulated emission) in the active region, but a enough gain to overcome all losses in the laser cavity as well as allow an output beam to be extracted, while still allowing laser action to continue. The minimum gain provided the active region that will permit lasing, given the cavity losses, is the threshold lasing gain of the laser medium. The wavelength range over which the gain spectrum of the active region exceeds this threshold gain helps define the transverse extent of the optical cavity. (For EP lasers, the lowest drive current level at which the output of the laser results primarily from stimulated emission rather than spontaneous emission is referred to as the lasing threshold current.) When the active region provides the threshold lasing gain, there will be a sufficient amount of radiative recombinations stimulated by photons, so that the number of photons traveling between the reflectors tends to increase, giving rise to amplification of light and lasing. This causes coherent light to build up in the resonant cavity formed by the two mirrors, a portion of which passes through one of the mirrors (the "exit" mirror) as the output laser beam.

Because a coherent beam makes multiple passes through the optical cavity, an interference-induced longitudinal mode structure or wave is observed. The wave along the laser cavity is a standing EM wave and the cavity of (effective) length L only resonates when the effective optical path difference between the reflected wavefronts is an integral number of whole wavelengths (the effective cavity length or optical path difference takes phase-shifting effects at the mirrors into account). That is, the effective optical path from one mirror to the other and back must be an integer multiple of the wavelength. The set of possible wavelengths that satisfy the standing wave condition is termed the set of longitudinal modes of the cavity. Although there are an infinite number of such wavelengths, only a finite number of these fall within the wavelength range over which the gain spectrum of the active region exceeds the threshold lasing gain. The laser will lase only at one or more of the possible longitudinal (wavelength) modes which fit into this wavelength range.

Semiconductor lasers may be edge-emitting lasers or surface-emitting lasers (SELs). Edge-emitting semiconductor lasers output their radiation parallel to the wafer surface, while in SELs, the radiation output is perpendicular to the wafer surface. The most common type of SEL is the vertical-cavity surface-emitting laser (VCSEL). The "vertical" direction in a VCSEL is the direction perpendicular to the plane of the substrate on which the constituent layers are deposited or epitaxially grown, with "up" being typically defined as the direction of epitaxial growth. In some designs, the output laser beam is emitted out of the top side, in which case the top mirror is the exit mirror. In other designs, the laser beam is emitted from the bottom side, in which case the bottom mirror is the exit mirror. The exit mirror typically has slightly lower reflectivity than the other ("backside") mirror.

VCSELs have many attractive features compared to edge-emitting lasers, such as low threshold current, single longitudinal mode, a circular output beam profile, scalability to monolithic laser arrays, and ease of fiber coupling. The shorter cavity resonator of the VCSEL provides for better longitudinal mode selectivity, and hence narrower linewidths. Because of their short cavity lengths, VCSELs have inherent single-frequency operation. Additionally, because the output is perpendicular to the wafer surface, it is possible to test fabricated VCSELs on the wafer before extensive packaging is done (wafer scale probing), in contrast to edge-emitting lasers, which must be cut from the wafer to test the laser. Also, because the cavity resonator of the VCSEL is perpendicular to the layers, there is no need for the cleaving operation common to edge-emitting lasers.

The VCSEL structure usually consists of an active (optical gain) region or layer sandwiched between two mirrors, such as distributed Bragg reflector (DBR) mirrors. DBRs are typically formed of multiple pairs of layers referred to as mirror pairs; DBRs are sometimes referred to as mirror stacks. The DBR mirrors of a typical VCSEL can be constructed from dielectric (insulating) or semiconductor layers (or a combination of both, including metal mirror sections). The pairs of layers are formed of a material system generally consisting of two materials having different indices of refraction, i.e. the DBR comprises alternating layers of high and low indexes of refraction. For semiconductor DBRs, the layers are typically selected so that they are easily lattice matched to the other portions of the VCSEL, to permit epitaxial fabrication thereof.

Both EP and OP VCSEL designs are possible. The two mirrors may be referred to as a top DBR and a bottom DBR; the top DBR often serves as the exit mirror. Because the optical gain is low in a vertical cavity design compared to an edge-emitting laser (because the photons in the cavity pass through the active region for a smaller percentage of the round-trip optical path), the reflectors require a high reflectivity in order to achieve a sufficient level of feedback for the device to lase.

For semiconductor DBRs, the number of mirror pairs per stack may range from 20–40 pairs to achieve a high percentage of reflectivity, depending on the difference between the refractive indices of the layers. A larger number of mirror pairs increases the percentage of reflected light (reflectivity). The difference between the refractive indices of the layers of the mirror pairs can be higher in dielectric DBRs, generally imparting higher reflectivity to dielectric DBRs than to semiconductor DBRs for the same number of mirror pairs and DBR thickness. Conversely, in a dielectric DBR, a smaller number of mirror pairs can achieve the same reflectivity as a larger number in a semiconductor DBR. However, it is sometimes necessary or desirable to use semiconductor DBRs, despite their lower reflectivity/greater thickness, to conduct current, for example (e.g., in an EP VCSEL). Semiconductor DBRs also have higher thermal (heat) conductivity than do dielectric DBRs, making them more desirable for heat-removal purposes, other things being equal. Semiconductor DBRs may also be preferred for manufacturing reasons (e.g., a thicker DBR may be needed for support) or fabrication reasons (e.g., an epitaxial, i.e. semiconductor, DBR may be needed if other epitaxial layers need to be grown on top of the DBR).

When properly designed, these mirror pairs will cause a desired reflectivity at the laser wavelength. VCSEL mirrors are typically designed so that the bottom (backside) DBR mirror (i.e. the one interposed between the substrate material and the active region) has nearly 100% reflectivity, while the top (exit) DBR mirror has a reflectivity that may be 98%–99.5% (depending on the details of the laser design). The partially reflective top mirror passes a portion of the coherent light built up in the resonating cavity formed by the active region and top and bottom mirrors. Of course, as noted above, in other designs, the bottom mirror may serve as the exit mirror, with the top mirror having the higher reflectivity.

In a VCSEL, it is often preferable for lasing to occur in only a single longitudinal and lateral (transverse) lasing mode (i.e., a fundamental mode) at or near desired resonant wavelength; the fundamental transverse electromagnetic mode (TEM) is also known as the $TEM_{00}$ mode. While the longitudinal modes correspond to standing waves between the laser mirrors, the TEM modes indicate the spatial or transverse distribution of intensity, in cross section of the beam, perpendicular to the optical axis of the laser. The intensity distribution of the fundamental transverse mode $TEM_{00}$ is Gaussian.

The transverse extent of the optical cavity must be defined in a VCSEL. The transverse lasing mode is often defined by implementing a means of confinement for photons and/or electrons. Electrical or current confinement is also desirable for EP VCSELs, in which electrical current is used to provide the means of pumping the active region to achieve gain. In an EP VCSEL, for example, top and bottom electrical contacts are typically provided above and below the active region so that a pumping current can be applied through the active region. Current-confinement approaches attempt to create a current-confinement structure to confine the pumping current into a relatively small area of the active region. Confining the current in this way is also sometimes referred to as current guiding or funneling. Such a structure may be employed in a VCSEL to block current flow through an annular perimeter region of the VCSEL structure, and to guide or confine the current to a more or less cylindrical more-conductive region in the center, which may be referred to as a current aperture or current-confinement aperture. Current confinement can provide lower threshold and higher efficiency, and can help the VCSEL operate with a single transverse mode.

Various techniques have been used to achieve electrical or current confinement, including ion implantation (irradiation) and oxidation approaches, as described in *Vertical-Cavity Surface-Emitting Lasers: Design, Fabrication, Characterization, and Applications,* eds. Carl W. Wilmsen, Henryk Temkin & Larry A. Coldren, Cambridge: Cambridge University Press, chapter 5 (1999); Y. H. Lee et al., *Electr. Lett.,* vol. 26, no. 11, pp. 710–711 (1990); and T. E. Sale, *Vertical Cavity Surface Emitting Lasers,* Research Press Ltd., pp. 117–127 (1995). Jewell et al., U.S. Pat. No. 4,949,350, for example, describes one current-confinement approach in which a post is etched through the structure. In another technique for current confinement, patterned ion implantation into the p-doped semiconductor top DBR mirror is used to change to properties of some of the semiconductor layers to make them more resistive. This forms an apertured, relatively high-resistivity ion-implanted current-confinement region, which guides the current predominantly through this aperture. In such an approach, implantation of ions into the top DBR mirror can render the material around the laser cavity (or an aperture thereof) relatively nonconductive, thus concentrating the injected current into the active medium. For example, in this ion-implanted approach, light ions such as protons are implanted to relatively deep depths (e.g., about 3 μm), into selected areas of the semiconductor laser surface, damaging the semiconductor crystal lattice and thus rendering those areas relatively nonconductive (more resistive or insulative). This forms a layer having a relatively resistive annular portion and a relatively conductive central aperture portion. Such implants thus define the transverse extent of the laser cavity. Other ion-implanted approaches are taught in Chirovsky et al., U.S. Pat. No. 6,169,756 B1 and Y. Qian et al., *Appl. Phys. Lett.,* vol. 71, no. 1, pp. 25–27 (1997).

Various oxide confinement based approaches have also been explored. In some approaches, insulating oxide layers can be located immediately adjacent to the active region, reducing current spreading and thus giving rise to lower threshold currents that are typically required with conventional ion-implanted VCSELs. One current-confinement approach (typically not utilized with VCSELs, however), employs an apertured, high resistivity oxide layer. It is formed by growing an oxide surface layer, then, using mask technology, etching away selected portions of the oxide. The oxide material is insulative (resistive) so current flows only into those areas of the underlying laser structure where the oxide layer has been removed (the aperture). In another approach, the native oxidation of AlGaAs layers may be used to form a resistive layer between the reflector and the active region. See for example D. Huffaker et al., *Appl Phys. Lett.,* vol. 65, no. 1, pp. 97–99 (1994) and K. D. Choquette et al., *Electr. Lett.,* vol. 30 no.24, pp. 2043–2044 (1994). Selective etching and undercutting of specific layers has also been proposed to form the current guiding aperture. See, for example, Scott et al., U.S. Pat. No. 5,594,751 and H. Deng et al., *Electr. Lett.,* vol. 32, no. 10, pp. 900–901 (1996).

As noted above, it is often desirable to achieve single transverse optical or lasing mode. Refractive index guiding may be used to guide the transverse lasing modes (e.g., to confine the optical mode similar to the manner in which an optical fiber guides light). For example, by etching a mesa into the VCSEL, the mesa itself can serve to confine the transverse optical modes, i.e. define the beam waist of the output laser radiation. However, index guiding is not always possible, practical, feasible, desirable, or sufficient.

Additionally, by confining the pumping current with a current-confinement structure, there will be some gain guiding of the transverse modes. However, such gain guiding is not always sufficient to achieve the desired transverse lasing mode. For example, it is generally desired to achieve as high as possible an output power, while maintaining single transverse mode operation. Single mode operation is important, for example, in telecommunications applications in which the laser output is to be coupled to a single-mode optical fiber. A larger current-confinement aperture will generally allow a greater pumping current to be employed and thus a greater output power to be obtained. On the other hand, the wider the current-confinement aperture, the more gain there is of higher-order modes. When the current-confinement aperture is wide enough, there will be multimode lasing. Thus, for a given VCSEL structure, there is a maximum current-confinement aperture size at which single transverse lasing mode operation is possible. The maximum single-mode current-confinement aperture size also sets an upper limit on the VCSEL's output power.

There is, therefore, a need for an improved VCSEL techniques and structures for maximizing output power and achieving single transverse lasing mode operation.

BRIEF DESCRIPTION OF THE DRAWINGS

Other features and advantages of the invention will become apparent upon study of the following description, taken in conjunction with the attached FIGS. 1–4.

FIG. 1 is a cross-sectional view of the layer structure of a VCSEL, in accordance with an embodiment of the present invention;

FIGS. 2A–F are cross-sectional views of the layer structure of the VCSEL of FIG. 1 at various stages of fabrication;

FIG. 6 is a cross-sectional view of the layer structure of a VCSEL having two composite antiguide/current-confinement structures, in accordance with an alternative embodiment of the present invention.

DETAILED DESCRIPTION OF THE INVENTION

Figure 2A:
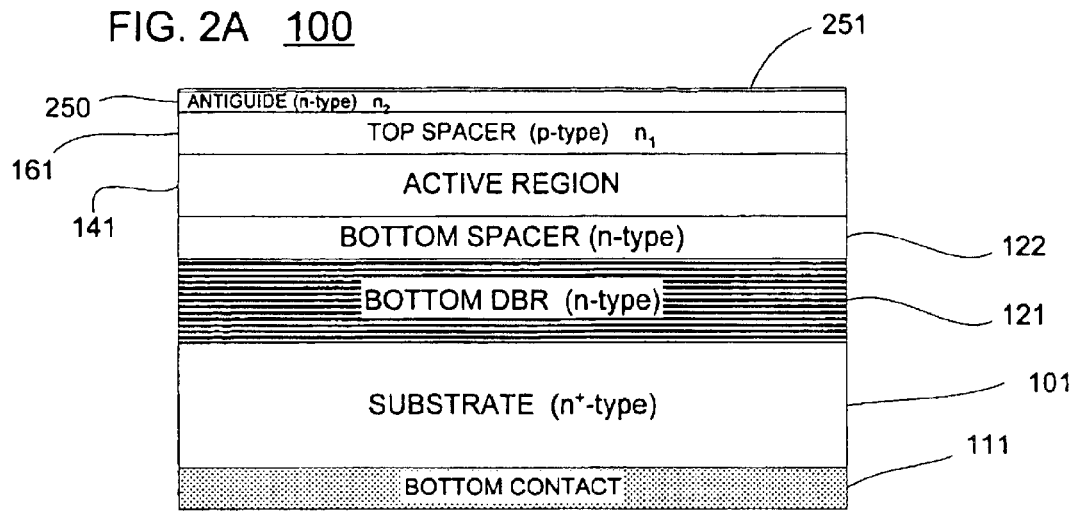
Figure 2B:
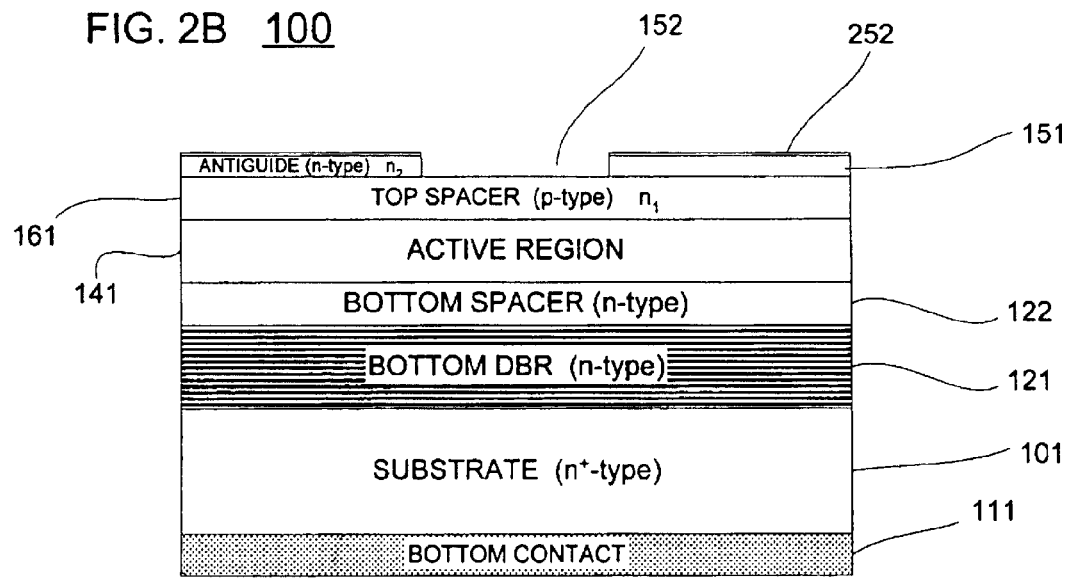

The present invention provides a surface-emitting laser (SEL), such as an EP VCSEL, having an intra-cavity antiguide structure for improving single transverse lasing mode operation, and associated methods, such as a method for fabricating the device and for generating single-mode laser light. In an embodiment, the antiguide structure is part of a composite antiguide/current-confinement structure of an EP VCSEL, which permits single-mode lasing at greater output power. The composite antiguide/current-confinement structure contains both an antiguide structure and a current-confinement structure. The current-confinement structure has a relatively resistive annular portion and a relatively conductive, central current aperture. The composite antiguide/current-confinement structure is contained in an upper (top) spacer layer (i.e., the layer between the active region and the top mirror); an intermediate layer of the top spacer layer contains an annular antiguide portion and a central, inner current-confinement aperture. The current-confinement aperture comprises the same material as the spacer layer, and has a first conductivity type. The annular antiguide structure has a higher index of refraction than the top spacer layer and current aperture, for antiguide purposes. In an embodiment, the annular antiguide structure also has a conductivity type opposite that of the top spacer layer, so that it forms part or all of the annular resistive portion of the current-confinement structure. The structure, operation, and methods of fabrication of the present invention and alternative embodiments are described in further detail below with reference to the drawings.

Referring now to FIG. 1, there is shown a cross-sectional view of the layer structure of a VCSEL 100 (not to scale), in accordance with an embodiment of the present invention. VCSEL 100 is formed on a substrate 101, which may contain multiple VCSELs substantially identical to and including VCSEL 100, i.e. VCSEL 100 may be part of a one- or two-dimensional array of VCSELs fabricated on the same substrate 101. Substrate 101 has opposing major surfaces, namely a top and bottom surface. A bottom contact, which may be metal, is disposed on the bottom major surface of substrate 101. This itself may be disposed on a submount (not shown), or it may actually be the submount.

In an embodiment, VCSEL 100 is an EP VCSEL powered by applying a pumping current through its active region, by means of top and bottom contacts 145, 111. VCSEL structure 100 comprises layers and structures fabricated on substrate 101 by epitaxial or other deposition techniques. In particular, the epitaxially grown layers of VCSEL structure 100 may be fabricated on a top major surface of wafer substrate 101 with epitaxial growth techniques such as molecular beam epitaxy (MBE), liquid phase epitaxy (LPE), a vapor phase epitaxy (VPE) process such as or metalorganic chemical vapor deposition (MOCVD, also known as MOVPE), or other known crystal growth processes. Other layers and structures that are not epitaxially grown may be deposited with non-epitaxial deposition techniques such as e-beam evaporation, thermal evaporation, or sputtering.

Substrate 101 consists of InP ($n^+$-type), although other substrates may be employed in alternative embodiments, such as GaAs or other known semiconductor materials. The initial part of the VCSEL structure 100, up to at least contact-facilitating layer 144, is epitaxially grown on substrate 101 (preferably by MBE) and consists of a first or bottom semiconductor DBR 121, a bottom (lower) spacer layer 122, an active region 141, and a top spacer layer 160. Top spacer layer 160 itself comprises a first top spacer portion 161 and a second top spacer portion 162, as well as an intermediate composite antiguide/current-confinement layer 150. Antiguide/current-confinement layer 150 includes an annular antiguide structure 151 and a substantially cylindrical current-confinement aperture 152.

Each layer of VCSEL 100 may itself comprise multiple layers of semiconductors of different composition and doping. The top spacer layer 160 may be referred to as either a current-spreading or spacer layer, because one function is to conduct ("spread" or "guide") current from a current supply to the active region, and another is to optimally position ("space") the active region axially (longitudinally) within the cavity (along with the positioning provided by bottom spacer layer 122).

As will be understood, for purposes of conducting current of the appropriate type (i.e., holes or electrons), layers on the bottom side of the active region that need to conduct pumping current are typically doped to have one conductivity type (e.g., n-type); layers on the top side of the active region that need to conduct pumping current are doped to have the other type (e.g., p-type). Thus, for example, substrate 101, bottom DBR 121, and bottom spacer 122 may be doped n-type, and current-conducting layers above active region 141, such as top spacer 161, 162, may be doped p-type. The opposite doping scheme may be employed in other embodiments, or some layers may be undoped, or more heavily doped (e.g., $p^+$ or $n^-$).

As will be appreciated, bottom and top spacer layers 122, 160 are used to help optimally position the active region 141 axially within the cavity. For example, by selecting the appropriate thicknesses of top and bottom spacer layers, the active region 141 is optimally placed at a maximum in the longitudinal mode's standing wave pattern to maximize gain. (Conversely, optically-absorptive (lossy) elements, such as heavily doped regions for metal contacts, are typically and preferably disposed at nulls in the standing wave pattern, where possible.) The top and bottom spacer layers preferably conduct both current and heat, and thus serve as current- and heat-spreading layers in addition to serving as spacing means. In an embodiment of the present invention, the top spacer layer also serves as a combined antiguide means/current-confinement means.

In an embodiment, bottom DBR 121 is a DBR consisting of multiple mirror pairs, each pair having layers of semi-conductor having a crystal lattice constant close to the substrate, where the two layers of each pair have differing indices of refraction. In an embodiment, DBR mirror 121 has about 40 n-type $In_xGa_yAl_{1-x-y}As$/InP mirror pair layers, which are also electrically conductive. As will be appreciated, each layer of the mirror pairs of the DBR has a quarter-wave optical thickness (QWOT), for a given desired emission wavelength (for this reason, DBRs are sometimes referred to as semiconductor quarterwave stacks). In another embodiment, InGaAsP/InP or other mirror pair layer materials may be employed. As an example, for a VCSEL designed to emit at or around 1550 nm (1.55 $\mu$m) light, the $In_xGa_yAl_{1-x-y}As$ (or InGaAsP, in an alternative embodiment) layers may be approximately 1122 Å thick and the InP layers may be approximately 1224 Å thick. This can yield a reflectivity of about 99.9%. In an embodiment, DBR 121 is about 9 $\mu$m thick.

Bottom spacer 122, in an embodiment, is a single layer of n-type InP and, in alternative embodiments, may consist of multiple semiconductor layers. In an embodiment, bottom spacer layer 122 is about 0.25 to 2 $\mu$m thick. Active region 141, in an embodiment, comprises a structure such as multiple quantum wells (MQWs) which provide a gain spectrum suitable for emitting radiation at the desired wavelength, e.g. 1550 nm. Active region 141 may consist of a material such as (undoped) InGaAsP/InP (or InAlGaAs/InP) having, for example, eight (8) quantum wells (QWs) (each QW having a QW layer and a corresponding QW barrier layer). In an embodiment, active region 141 is about 0.1 to 0.2 µm thick. In alternative embodiments, active region 141 could have a single quantum well, superlattice, or other structure instead of an MQW structure.

In the present invention, the top spacer layer 160 of completed VCSEL structure 100 of FIG. 1 also comprises a composite antiguide/current-confinement structure 150. In particular, top spacer layer 160 comprises first and second top spacer layer portions 161, 162, and composite antiguide/current-confinement structure layer 150. Both top spacer layer portions 161, 162 are formed of single layers of p-type InP, but may consist of multiple layers in alternative embodiments. In an embodiment, top spacer layer 160 is about 0.25 to 2 µm thick overall.

Referring now to FIGS. 2A–F, there are shown cross-sectional views of the layer structure of VCSEL 100 of FIG. 1 at various stages of fabrication. Referring in particular to FIG. 2A, the layer structure resulting after the first epitaxial growth phase is shown. As illustrated, the first top spacer layer portion 161, consisting of p-type InP, is epitaxially grown on active region 141. Next, a layer of n-type InGaAsP, which will become antiguide structure 151, is grown on top of first top spacer 161. In an embodiment, a thin (e.g., 200 Å) layer 251 of additional spacer layer material (e.g., InP) may be grown on top of antiguide layer 250, because its material (InP) can be cleaned more easily after processing, for subsequent regrowth, than can the material of the antiguide structure 151 (InGaAsP), in some embodiments. At this point in fabrication, the wafer sample has substrate 101, bottom DBR 121, bottom spacer 122, active region 141, first top spacer layer 161, antiguide layer 250 (which will become annular antiguide structure 151 after processing), and a thin, protective layer 251 of spacer layer disposed on antiguide material layer 250. Bottom metal contact 111 may be disposed on the back (bottom) side of substrate 101 at this point, or at a later stage of the fabrication process.

Next, to further form the structure of top spacer layer 160 and composite antiguide/current-confinement structure 150, a cylindrical (circular cross-section) opening that will become current aperture 152 is then etched into or otherwise formed in the n-type InGaAsP layer 150 (and thin protective spacer layer 251), leaving annular antiguide structure 151 (covered by a thin, annular spacer layer 252). As used herein, "annular" refers to shape surrounding a central opening, which central opening may have a substantially circular (generally preferred for VCSELs) cross section and thus be substantially cylindrical. The central opening of the annular structure may also be rectangular, elliptical, or other shape.

Figure 2C:
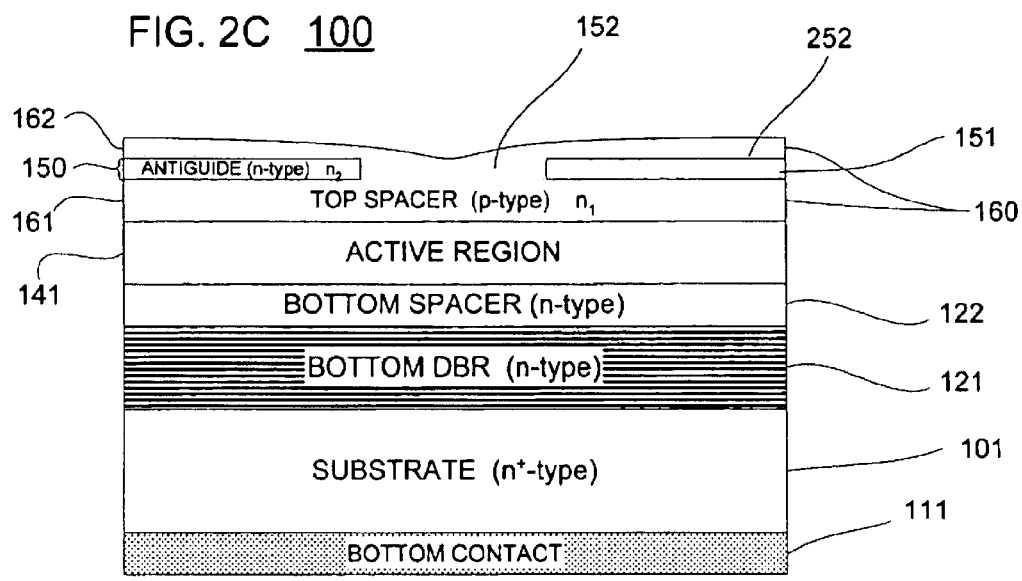
Figure 2D:
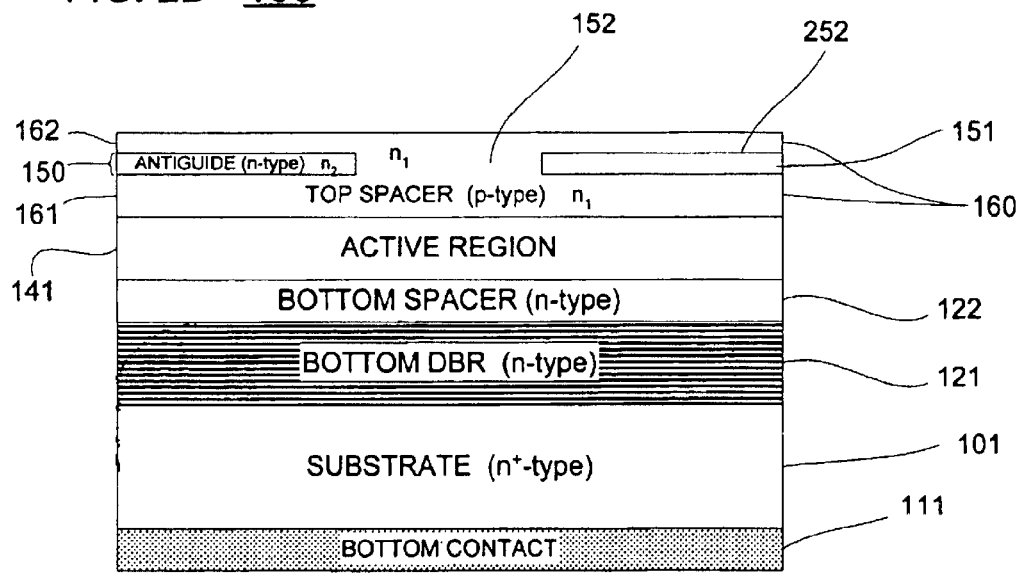

Next, before regrowth, the sample is cleaned. In a following regrowth step (so-called because it is a separate epitaxial growth step performed after intervening processing steps following an initial epitaxial growth sequence), as illustrated in FIG. 2C, further p-type InP material is epitaxially regrown (i.e., grown during a regrowth phase) on the sample, to form second top spacer layer 162, thereby also forming current aperture 152 which also consists of spacer layer type material. Initially the top surface of the growing layer 162 will be uneven (lower over the central opening) due to the etched central opening of the antiguide structure, a shown in FIG. 2C, but will begin to flatten as the layer grows thicker, as shown in FIG. 2D. In FIGS. 2C, 2D, dotted lines at the boundaries between spacer layer 162 and 161, and between spacer layer 162 and 252, indicate that epitaxial regrowth of the spacer layer material (InP) on top of the same previously-grown material occurs virtually seamlessly.

Thus, annular spacer layer structure 252 may be considered to be a integrated part of second top spacer layer 162; and first top spacer layer 161 and second top spacer layer 162 may be considered to be seamlessly integrated spacer layer portions of spacer layer 160 (i.e., the dotted lines may be ignored).

Preferably, the epitaxial growth step proceeds long enough that there is a substantially flat top surface of second top spacer layer 162, one that is flat enough to serve as an adequate support on which to deposit or grow the top DBR 148 and other remaining structures.

Next, as shown in FIG. 2E, a thin contact-facilitating layer 244 is epitaxially regrown on the top of second top spacer layer 162 during the epitaxial regrowth phase. After suitable processing, as shown in FIG. 2F, layer 244 becomes annular contact-facilitating layer 144, which is disposed on top spacer layer 160 around the perimeter of the transverse optical cavity. The contact-facilitating layer 244 (and thus 144) is formed of a material suitable for bonding with a metal contact, in that it has a lower contact resistance. Contact-facilitating layer 144 may be about 250 Å to 500 Å thick. A metal contact layer 245, e.g. a gold (Au) layer (FIG. 2E), which will become annular metal contact 145 after patterned liftoff (FIG. 2F), is deposited on top of contact-facilitating layer 144. In an embodiment, layer 144 consists of a doped InGaAs layer for electrical contact (with a doping density of about $5 \times 10^{19}/cm^3$). Such a material has a much lower contact resistance with the metal contact 145 than InP layer 162 would have.

In alternative embodiments, contact-facilitating layer 144 is formed on or in current-spreading/spacer layer 162 with non-epitaxial techniques, such as deposition; diffusing a dopant into a top portion of second top spacer layer 162; or with rapid thermal annealing processes during the metallization process in which metal contact 145 is deposited, in which the metal of contact 145 diffuses into or intermixes with the semiconductor material at the top of spacer layer 162, thereby enabling the formation of a low resistance ohmic contact. In this latter approach, the rapid thermal annealing causes the metal and semiconductor to intermix in a region under the metal contact. In this case, the intermixed layer at the boundary of and between the semiconductor spacer layer 162 and the metal contact 145 may be considered to be an intermediate contact-facilitating layer 144 between the metal contact and the layer 162.

Next, as illustrated in FIG. 2F, a cylindrical opening 260 is formed into layers 245 and 244, e.g., by liftoff of metal from metal contact layer 245 and by etching into contact-facilitating layer 244, to result in annular top contact 145 and contact facilitating layer 144, with a central aperture 260 exposing the top surface of spacer layer 162. This central aperture 260 permits the top DBR 148 to be deposited on the top surface of spacer layer 162, to complete the VCSEL cavity. This opening is centered on the aperture 152 and thus within the optical cavity.

As will be appreciated, the optical cavity is a cylindrical or substantially columnar volume in space in which coherent light is reflected back and forth by top and bottom mirrors 148, 121, passing through active region 141 where sufficient amplification by stimulated emission to support lasing occurs. It is the region in which there is threshold gain in the active region, i.e. the peak and nearby portions of the gain spectrum of the active region in which the gain is sufficient to support lasing.

Semiconductor active region 141 is thus within the laser cavity and has a structure and material suitable for amplifying light, by stimulated emission, at the lasing wavelength, at a gain greater than the threshold lasing gain. The longitudinal extent of the cavity is defined by the top and bottom mirrors 148, 121, and the transverse extent may be defined by a combination of factors, including structural features of the laser structure itself (e.g., if there is a mesa), refractive index guiding, and gain guiding. As pumping current flows through the comparatively narrow current aperture 152, it spreads laterally before it reaches active region 141. It therefore gives rise to stimulated emission in a central region of active region 141, larger than the current aperture 152 (although the gain is greater in the center). In FIG. 1, the maximum transverse extent of the optical cavity is indicated by dashed lines 153. As will be appreciated, the more or less cylindrical volume indicated by dashed lines 153 is the maximum extent of the transverse optical cavity, due to the blocking of light and reflection by the inner diamer of annular top contact 145. Depending on how much current spreading there after pumping current is guided to flow through current aperture 152, there will be sufficient gain to give rise to lasing in the active region over a substantially circular region approximately the diameter indicated by lines 153, or slightly smaller than this diamter in alternative embodiments or at different pumping levels. However, for convenience of illustration, the volume indicated by dashed lines 153 will be referred to as the optical cavity.

Next, a dielectric top DBR 148 is deposited, having several mirror pairs. The top surface of spacer layer 162 may be cleaned before depositing top DBR 148. Depending on the application, various types of mirror pair materials may be employed, such as $SiO_2/Ta_2O_5$ or $Si/SiO_2$. Top mirror 148 is disposed axially above the top spacer layer 160, either directly on the top surface of top spacer layer 162 or on top of some layer itself above the top spacer layer 162. I.e., top mirror 148 is disposed axially above the top spacer layer 160, either with or without intervening layers between. Top DBR 148 forms the top mirror for the VCSEL, and completes and defines the longitudinal optical cavity. In an alternative embodiment, the top mirror 148 is a semiconductor DBR, or a composite DBR having both semiconductor and dielectric portions.

Figure 3:
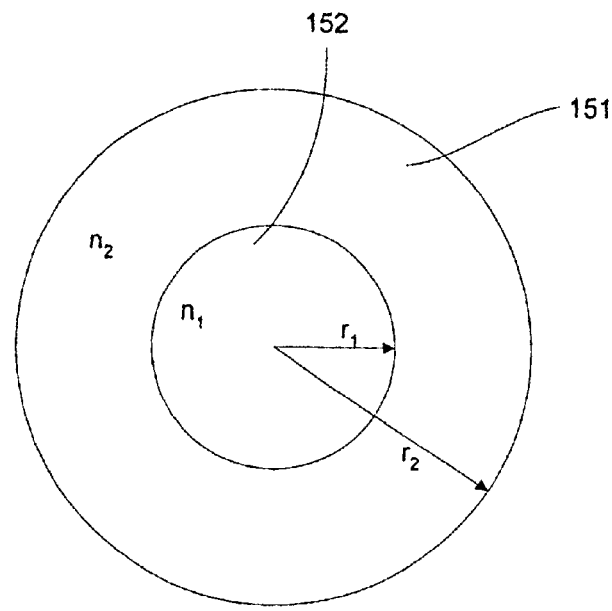
FIG. 3 is a top view of the antiguide/current-confinement layer of the VCSEL of FIG. 1.

A probe or wire bond (not shown) may be electrically coupled to annular metal contact 145, to provide pumping current to VCSEL 100. In an embodiment, the diameter of the annular metal contact 145 (at its outer, circular edge) is about 15 $\mu$m; the diameter of the inner circular edge of metal contact 145 (also the approximate diameter of transverse optical cavity 153) is about 5-7 $\mu$m; the diameter of current-confinement aperture 152 is about 3 $\mu$m. Other sizes may be used in other embodiments and applications. Referring now to FIG. 3, there is shown a top view of the antiguide/current-confinement layer 150 of VCSEL 100, showing the cross-section and relative positions of current aperture 152 and annular portion 151. Using the parameters of the above-noted embodiment, index of refraction $n_2 > n_1$, radius $r_1$ 1.5 $\mu$m, and $r_2$ 2.5-3.5 $\mu$m. In this embodiment, radius $r_1$ also denotes the inner aperture size of the antiguide structure 152, since it is the same in this embodiment as the current aperture 152.

Referring once more to FIG. 1, a bottom metal contact 111 is disposed on the back (bottom) side of substrate 101. Thus, contacts 145, 111 provide electrical contacts above and below, respectively, active region 141. In an alternative embodiment, bottom contact 111 is disposed elsewhere within the VCSEL structure, below active region 141, e.g. on the top side of the substrate using an etch to open a contact to a conductive layer below the active region.

As noted above, the material for antiguide structure 151 is selected to have an index of refraction $n_2$ (at or near the target lasing wavelength) greater than that ($n_1$) of the surrounding material of top spacer layer 160 and, in particular, of the material in current aperture 152. Thus, annular antiguide structure 151 is disposed within the laser cavity 153, and thus necessarily between the active region 141 and one of the laser cavity mirrors (e.g. between active region 141 and mirror 148). The annular antiguide structure 151 is composed of an antiguide material, and has a central opening 152, which is filled with a second material having a lower index of refraction for light at the lasing wavelength than the antiguide material. Thus, the annular antiguide structure causes preferential antiguiding of higher order transverse lasing modes in the laser cavity.

In an embodiment, as described above with reference to FIG. 1, antiguide structure 151 is composed of n-type InGaAsP, which has a higher index of refraction than that of the p-type InP of top spacer layers 161, 162 (and current aperture 152), at all possible lasing wavelengths within the gain spectrum of the active region 141, e.g. at lasing wavelengths at or near 1550 nm.

In particular, InP has an index of refraction of approximately 3.166 at telecommunications wavelengths such as wavelengths near 1550 nm, and InGaAsP has an index of refraction of about 3.2 to 3.4 in a similar wavelength range, depending on the relative composition of the constituent elements. Semiconductor materials other than InGaAsP that also have an index of refraction greater than $n_1$ may also be employed.

EP VCSEL 100 is powered by applying a pumping current from an external pumping current source (not shown) through its active region 141, by means of top and bottom contacts 145, 111, respectively, via wire bond or probe to the upper surface of metal top contact 145. When such a pumping current is applied to the VCSEL, the current flows down through annular metal contact 145, through annular contact-facilitating layer 144 and then laterally through current-spreading/spacer layer 162, because it is blocked by the reverse-biased p-n junctions formed between p-type top spacer 160 material and n-type antiguide structure 151 material. Thus, the current is guided toward the center of the VCSEL structure, and down through the aperture 152. After exiting current aperture 152, the current begins to spread out laterally into current-spreading/spacer layer 161 and into active region 141. Thus, there is optical gain sufficient to support lasing in the approximate region of the transverse optical cavity 153.

The presence of annular antiguide structure 151 inside transverse optical cavity 153 gives rise to an antiguide effect, as will be appreciated. In particular, annular antiguide structure 151 causes relatively greater (preferential) antiguiding of the higher order transverse lasing modes, thus helping to introduce effective relative loss in the higher order lasing modes. Thus, antiguide structure 151 preferentially removes higher order TEM modes from the resonant cavity, thereby suppressing them. This permits current aperture 152 to have a larger diameter (and consequently, to permit a greater pumping current and greater output power) while still supporting single transverse mode lasing.

There will be more antiguiding effect the greater the ratio $n_2/n_1$; the thicker is layer 150 and thus antiguide structure 151; and the closer antiguide structure 151 is positioned to an antinode of the lateral optical cavity. Also, the antiguide effect can be adjusted by varying the diameter of the inner aperture of the antiguide structure (e.g., radius $r_1$ of FIG. 3 and radius $r_3$ of FIG. 4). Antiguide structure 151 may be about 250 Å to 3000 Å thick, in an embodiment, although different thicknesses may be employed.

Composite antiguide/current-confinement structure 150 contains both antiguide structure 151, and also a current-confinement structure. In the embodiment shown in FIG. 1, annular antiguide structure 151 performs a dual role of antiguiding higher order transverse lasing modes and also blocking pumping current and forcing it through aperture 152, i.e. annular antiguide structure 151 is both an annular antituide structure, and also serves as the annular resistive portion of the current-confinement structure of composite antiguide/current-confinement structure 150. The portion of spacer layer material surrounded by annular antiguide structure 151 is the current aperture for the current-confinement structure.

In the embodiments described above, the composite antiguide/current-confinement structure is within the current-spreading layer between the active region and the top mirror (DBR). In alternative embodiments, a composite antiguide/current-confinement structure is located within the current-spreading layer between the active region and the bottom mirror. In either embodiment, the composite antiguide/current-confinement structure is disposed axially within the cavity, between the cavity mirrors, and thus necessarily between the active region and one of the cavity mirrors. In another embodiment, there may be annular antiguide structures both above and below the active region, that is, there may be one in the top spacer layer and one in the bottom spacer layer, as illustrated in the alternative embodiment in FIG. 6. VCSEL 600 of FIG. 6 is similar to the structure of VCSEL 100 of FIG. 1, except that VCSEL 600 comprises top composite antiguide/current-confinement layer 150 within top spacer 160, as well as a second, bottom composite antiguide/current-confinement layer 650 within bottom spacer 122. As can be seen, the annular antiguide portion 651 of structure 650 is doped p-type, opposite that of the n-type doping of the material of bottom spacer layer 122, to perform current-confinement functions as well as antiguiding. In this case, there is at least one annular antiguide structure (and preferably, at least one composite antiguide/current-confinement structure) within the longitudinal cavity, longitudinally between the active region and one of the two cavity mirrors.

In an alternative embodiment, instead of or in addition to the annular antiguide structure being doped to have a conductivity type opposite that of the top spacer layer, it is doped with a material, such as iron or titanium, that increases its resistivity, e.g. by introducing defects into the primary semiconductor material of the annular antiguide structure.

In general, in the embodiments described herein, a VCSEL in accordance with the present invention comprises a top spacer layer (e.g., 160) disposed between the active region and the top DBR, where the top spacer layer comprises spacer layer material of appropriate doping and conductivity to conduct current from a top contact to the active region, and also comprises at least an annular antiguide structure formed of material having a higher index of refraction than the spacer layer material. In one embodiment, the annular antiguide structure is doped opposite to the conductivity type of the top spacer layer material, so that it also impedes current flow. Alternatively, the annular antiguide structure may be doped with a conductivity-inhibiting material such as iron or titanium, to increase its resistivity and thus to guide current through the current aperture. Thus, in this embodiment, the top spacer layer comprises a current-confinement structure having a resistive annular section and a conductive current aperture, where the annular antiguide structure serves as either part or all of the resistive annular portion of the current-confinement structure.

Figure 4:
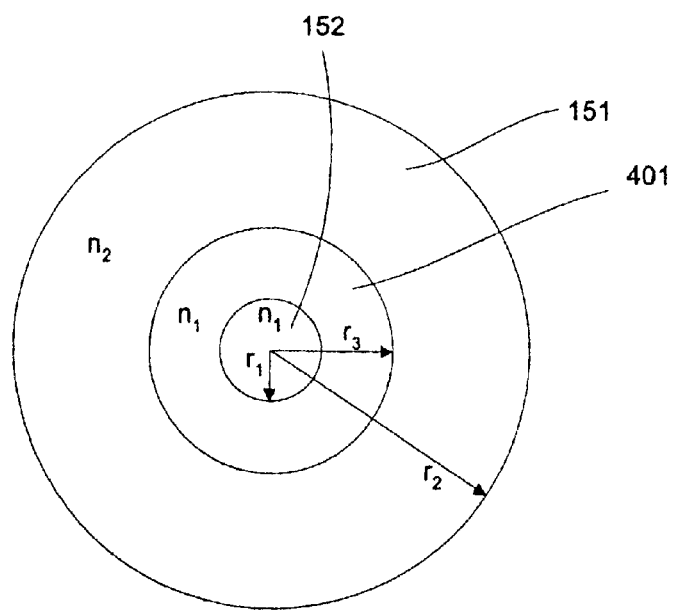
FIGS. 4–5 are top views of alternative antiguide/current-confinement layers of the VCSEL of FIG. 1.

In the embodiment of FIG. 1, the annular antiguide structure serves as the entire resistive annular portion of the current-confinement structure. However, in alternative embodiments, the annular antiguide structure serves as only part of the resistive annular portion of the current-confinement structure, as illustrated in FIG. 4. Referring now to FIG. 4, there is shown a top view of an alternative antiguide/current-confinement layer 150 of VCSEL 100, showing the cross-section and relative positions of current aperture 152 and annular portion 151. FIG. 4 illustrates an embodiment in which the current aperture 152 (radius $r_1$) is smaller in diameter than the inner diameter (radius $r_3$) of the annular antiguide section 151 (outer radius $r_2$). As with FIGS. 3 and 1, index of refraction $n_2 > n_1$; and radius $r_1$ 1 $\mu$m, and $r_2$ 2.5-3.5 $\mu$m. The annular resistive section 401 also blocks current flow, as does antiguide structure 151. For example, annular resistive section 401 may be an oxidized or ion-implanted section of spacer layer material. Such a structure permits independent control of the current aperture size and antiguide structure inner aperture size.

Figure 5:
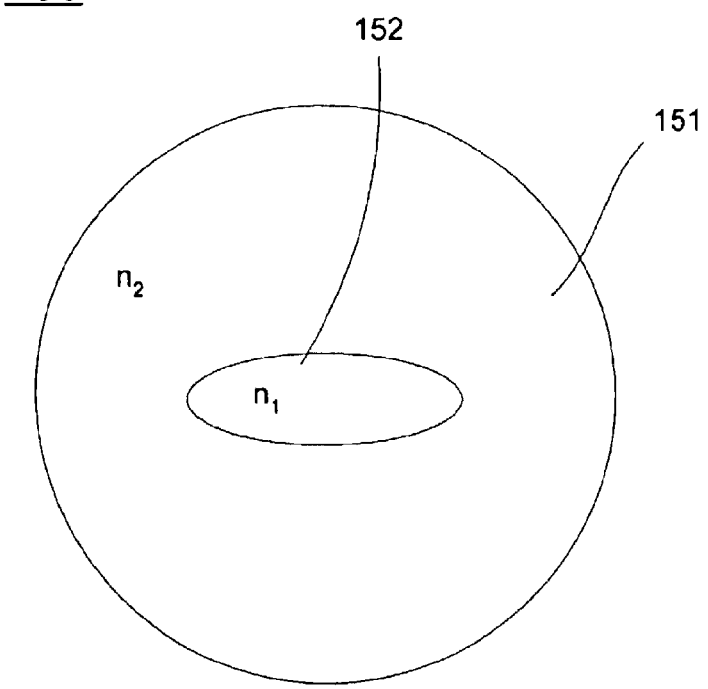

In alternative embodiments current-confinement aperture 152 (and thus the inner aperture of the antiguide structure, in the embodiment of FIG. 1) may have a cross-section other than circular, e.g. rectangular, elliptical, or other "oblong" (non-circular and non-square) shape. I.e., the cross-section is a shape that is substantially asymmetrical with respect to the X and Y axes, that is, substantially longer in some arbitrary X axis than in a corresponding Y axis. Shapes such as (non-circular) ellipses and (non-square) rectangles are examples of shapes that are asymmetrical with respect to X and Y axes. An elliptical or rectangular cross-sectional current-aperture may be employed, for example, to provide for a predetermined polarization of the laser output. In this case, the central opening is substantially columnar with a cross-section that is substantially asymmetrical with respect to X and Y axes so as to provide for polarization of the laser light. Referring now to FIG. 5, there is shown a top view of an alternative antiguide/current-confinement layer 150 of VCSEL 100, showing the cross-section and relative positions of current aperture 152 and annular portion 151. In the embodiment of FIG. 5, aperture 152 is elliptical instead of circular.

In alternative embodiments, the annular antiguide structure is substantially annular but need not be completely closed; e.g., it may have a "C" or horse-shoe type shape, or have a plurality of curved arcs or sections around a central opening or region. In these latter embodiments, the annular region comprising the antiguide material may also comprise some current-spreading material, where the antiguide material is still sufficient to perform some antiguiding of the higher-order modes in the cavity. However, in this case, the current aperture does need to be surrounded by a closed, annular resistive portion of the current-confinement structure. Thus, where there are openings in the substantially annular antiguide structure and where the antiguide structures forms part of the annular resistive portion of the current-confinement structure, the opening will be filled with spacer material, that needs to be resistive so as to complete the annular resistive portion. For example, these sections may be subjected to selective ion implantation or oxidation to provide enhanced resistivity.

In alternative embodiments, e.g., a VCSEL having an antiguide structure in accordance with the present invention may be an external-cavity VCSEL (i.e., vertical external-cavity surface-emitting laser (VECSEL)) in which the top (exit) mirror is physically separated and mounted above the top surface and top spacer layer the epitaxially-grown portion of the VCSEL.

In general, an EP VCSEL in accordnace with the present invention has at least one spacer layer, between the active region and one the two cavity mirrors. The spacer layer has first and second spacer layer portions composed of a spacer layer material, and a composite antiguide/current-confinement structure disposed between the first and second spacer layer portions. The spacer layer material is an electrically-conductive material suitable for conducting a laser pumping current, and the composite antiguide/current-confinement structure comprises an annular antiguide structure and a current-confinement aperture consisting of the spacer layer material of the central opening of the annular antiguide structure. The antiguide structure comprises antiguide material having a greater index of refraction for light at the lasing wavelength than the spacer layer material, and preferably doped to provide resistance (e.g., doped the opposite conductivity type). The first spacer layer portion is disposed directly on the active region, whereby laser pumping current may be conducted through the second spacer layer portion, thence into and through the current-confinement aperture, thence through first spacer layer portion and into the active region.

In an embodiment, an annular antiguide structure in accordance with the present invention may be employed with a SEL other than a VCSEL, or with an OP VCSEL instead of with an EP VCSEL. In the latter case, the annular antiguide structure may still be placed inside a spacer layer (which does not double as a current-spreading layer in such an embodiment), but need not be doped differently than the spacer layer, since it need not form a reverse-biased junction to resist current flow. In such an OP VCSEL alternative embodiment, in which the annular antiguide structure is not part of a current-spreading layer, it may alternatively placed between the active region and the bottom mirror, instead of between the active region and the top mirror. In either OP VCSEL embodiment, the annular antiguide structure is axially within the cavity, between the cavity mirrors, and thus necessarily between the active region and one of the cavity mirrors.

In the present application, a "non-section-112(6) means" for performing a specified function is not intended to be a means under 35 U.S.C. section 112, paragraph 6, and refers to any means that performs the function. Such a non-section-112(6) means is in contrast to a "means for" element under 35 U.S.C. section 112, paragraph 6 (i.e., a "section-112(6) means"), which literally covers only the corresponding structure, material, or acts described in the specification and equivalents thereof.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. A surface-emitting laser for generating laser light at a lasing wavelength, the laser comprising:
    a first mirror and a second mirror positioned so as to define a laser cavity therebetween;
    a semiconductor active region disposed between the first and second mirrors for amplifying, by stimulated emission, light in the laser cavity at the lasing wavelength; and
    a spacer layer disposed between the active region and one of the first and second mirrors, the spacer layer comprising an annular antiguide structure disposed within the laser cavity, the annular antiguide structure consisting of an antiguide material and having a central opening, the central opening consisting of a spacer layer material having an index of refraction for light at the lasing wavelength smaller than that of the antiguide material, whereby the annular antiguide structure causes preferential antiguiding of higher order transverse lasing modes in the laser cavity.

2. The laser of claim 1, wherein the central opening is substantially cylindrical.

3. The laser of claim 1, wherein the central opening is substantially columnar with a cross-section that is substantially asymmetrical with respect to X and Y axes so as to provide for polarization of the laser light.

4. The laser of claim 3, wherein the cross-section of the central opening is substantially elliptical or substantially rectangular.

5. The laser of claim 1, wherein:
    the spacer layer comprises first and second spacer layer portions composed of the spacer layer material and a composite antiguide/current-confinement structure disposed between the first and second spacer layer portions;
    the laser is an electrically-pumped laser;
    the spacer layer material is an electrically-conductive material suitable for conducting a laser pumping current;
    the composite antiguide/current-confinement structure comprises the annular antiguide structure and a current-confinement aperture consisting of the spacer layer material of the central opening of the annular antiguide structure; and
    the first spacer layer portion is disposed directly on the active region, whereby laser pumping current may be conducted through the second spacer layer portion, thence into and through the current-confinement aperture, thence through the first spacer layer portion and into the active region.

6. The laser of claim 5, wherein the laser is a vertical-cavity surface-emitting laser (VCSEL).

7. The laser of claim 5, wherein:
    the first mirror is a bottom mirror and the second mirror is a top, exit mirror;
    the spacer layer is disposed between the active region and the top mirror; and
    the top mirror is disposed on the second spacer layer portion.

8. The laser of claim 7, further comprising a second spacer layer disposed between the active region and the bottom mirror, wherein the thicknesses of the spacer layer and the second spacer layer are selected so as so position the active region axially within the laser structure at a maximum in the longitudinal mode's standing wave pattern, thereby maximizing the amplification provided by the active region.

9. The laser of claim 5, wherein:

the composite antiguide/current-confinement structure comprises the annular antiguide structure and a current-confinement structure, the current-confinement structure comprising a resistive annular portion and the current-confinement aperture, said current-confinement aperture being more conductive than the resistive annular portion; and the annular antiguide structure forms part or all of the resistive annular portion of the current-confinement structure.

10. The laser of claim 9, wherein the first mirror comprises a first distributed Bragg reflector (DBR) mirror and the second mirror comprises a second DBR mirror.

11. The laser of claim 9, wherein:

the spacer layer material is doped to have a first conductivity type; and the antiguide material is doped to have a second conductivity type opposite that of the spacer layer material, whereby reverse biased p-n junctions are formed between the spacer layer material and the antiguide material during laser operation so that the annular antiguide structure is resistive to pumping current relative to the current-confinement aperture.

12. The laser of claim 11, wherein:

the first mirror is a bottom mirror and the second mirror as a top, exit mirror;

the spacer layer is disposed between the active region and the top mirror;

the top mirror is disposed on the second spacer layer portion;

the laser further comprising a bottom spacer layer disposed between the active region and the bottom mirror, wherein the thicknesses of the spacer layer and the bottom spacer layer are selected so as to position the active region axially within the laser structure at a maximum in the longitudinal mode's standing wave pattern, thereby maximizing the amplification provided by the active region; and the bottom spacer layer is doped to have the second conductivity type.

13. The laser of claim 12, wherein the spacer layer material is doped p-type, the antiguide material is doped n-type, and the bottom spacer layer is doped n-type.

14. The laser of claim 13, wherein the spacer layer material is InP, the antiguide material is InGaAsP, and the bottom spacer layer is composed of InP.

15. The laser of claim 14, wherein:

the first mirror comprises an epitaxial bottom DBR mirror comprising a plurality of n-type $In_xGa_yAl_{1-x-y}As$/InP mirror pair layers; and the second mirror comprises a dielectric top DBR mirror comprising a plurality of dielectric mirror pair layers.

16. The laser of claim 15, wherein the active region comprises a plurality of InGaAsP/InP quantum well structures.

17. The laser of claim 12, wherein the spacer layer material is InP, the antiguide material is InGaAsP, and the bottom spacer layer is composed of InP.

18. The laser of claim 11, wherein:

the first mirror is a bottom DBR mirror and the second mirror is a top, exit DBR mirror;

the spacer layer is disposed between the active region and the top mirror;

the top mirror is disposed on the second spacer layer portion;

the laser further comprising a bottom spacer layer disposed between the active region and the bottom mirror;

the laser further comprising a bottom contact and an annular top contact disposed around the top DBR mirror and on the second spacer layer portion of the spacer layer.

19. The laser of claim 9, wherein the spacer layer material is InP and the antiguide material is InGaAsP.

20. The laser of claim 19, wherein:

the spacer layer material is doped to have a first conductivity type; and the antiguide material is doped to have a second conductivity type opposite that of the spacer layer material, whereby reverse biased p-n junctions are formed between the spacer layer material and the antiguide material during laser operation so that the annular antiguide structure is resistive to pumping current relative to the current-confinement aperture.

21. The laser of claim 20, wherein the spacer layer material is doped p-type end the antiguide material is doped n-type.

22. The laser of claim 9, wherein:

the spacer layer material is doped to have a first conductivity type; and the antiguide material is an epitaxially grown material which is doped with a material sufficient to introduce defects into the crystalline lattice structure of the antiguide material so that the annular antiguide structure is resistive to pumping current relative to the current-confinement aperture.

23. The laser of claim 22, wherein the material with which the antiguide material is doped is iron or titanium.

24. The laser of claim 9, wherein the annular antiguide structure comprises all of the resistive annular portion of the current-confinement structure, whereby the current-confinement aperture fills substantially all of the central opening of the annular antiguide structure.

25. The laser of claim 9, wherein the current-confinement structure comprises a second resistive annular portion composed of the spacer layer material but having a higher resistivity than the spacer layer material of the current-confinement aperture, the second resistive annular portion disposed radially inside the central opening of the annular antiguide structure and and outside the current-confinement aperture, whereby the central opening of the annular antiguide structure is inside the laser cavity and is larger than the current-confinement aperture.

26. The laser of claim 1, wherein the first mirror comprises a first DBR mirror and the second mirror comprises a second DBR mirror.

* * * * *